US008110338B2

(12) United States Patent
Loccufier et al.

(10) Patent No.: US 8,110,338 B2
(45) **Date of Patent: *Feb. 7, 2012**

(54) HEAT-SENSITIVE POSITIVE-WORKING LITHOGRAPHIC PRINTING PLATE PRECURSOR

(75) Inventors: Johan Loccufier, Zwijnaarde (BE); Stefaan Lingier, Assenede (BE); Hubertus Van Aert, Pulderbos (BE); Jan Venneman, Berchem (BE); Marc Van Damme, Bonheiden (BE)

(73) Assignee: Agfa Graphics NV, Mortsel (BE)

( * ) Notice: Subject to any disclaimer, the term of this patent is extended or adjusted under 35 U.S.C. 154(b) by 685 days.

This patent is subject to a terminal disclaimer.

(21) Appl. No.: 12/280,597

(22) PCT Filed: Feb. 20, 2007

(86) PCT No.: PCT/EP2007/051612

§ 371 (c)(1),
(2), (4) Date: Aug. 25, 2008

(87) PCT Pub. No.: WO2007/099047

PCT Pub. Date: Sep. 7, 2007

(65) Prior Publication Data

US 2009/0170028 A1 Jul. 2, 2009

Related U.S. Application Data

(60) Provisional application No. 60/780,712, filed on Mar. 8, 2006.

(30) Foreign Application Priority Data

Feb. 28, 2006 (EP) .................................... 06110501

(51) Int. Cl.
*G03F 7/004* (2006.01)
*G03F 7/09* (2006.01)
*G03F 7/032* (2006.01)

(52) U.S. Cl. ..................... 430/271.1; 430/302; 430/906; 430/908; 430/944

(58) Field of Classification Search ............... 430/270.1, 430/271.1, 276.1, 300, 302, 905, 906, 908, 430/910, 944
See application file for complete search history.

(56) References Cited

U.S. PATENT DOCUMENTS

| | | | | |
|---|---|---|---|---|
| 5,340,699 | A * | 8/1994 | Haley et al. | 430/302 |
| 2010/0055610 | A1* | 3/2010 | Loccufier et al. | 430/271.1 |

FOREIGN PATENT DOCUMENTS

| | | | |
|---|---|---|---|
| EP | 0 864 420 | A1 | 9/1998 |
| EP | 0 909 657 | A2 | 4/1999 |
| EP | 1 072 432 | A2 | 1/2001 |
| EP | 1 120 246 | A2 | 8/2001 |
| EP | 1 211 065 | A2 | 6/2002 |
| EP | 1 241 003 | A2 | 9/2002 |
| EP | 1 262 318 | A2 | 12/2002 |
| EP | 1 275 498 | A2 | 1/2003 |
| EP | 1 291 172 | A2 | 3/2003 |
| EP | 1 338 416 | A2 | 8/2003 |
| EP | 1 433 594 | A2 | 6/2004 |
| EP | 1 268 660 | B1 | 7/2004 |
| EP | 1 439 058 | A2 | 7/2004 |
| EP | 1 311 394 | B1 | 12/2004 |
| EP | 1 263 590 | B1 | 3/2005 |
| EP | 1 011 970 | B1 | 2/2006 |
| EP | 1 299 238 | B1 | 2/2007 |
| EP | 1 368 413 | B1 | 7/2008 |
| JP | 2000-019724 | * | 1/2000 |
| WO | 01/96119 | A1 | 12/2001 |
| WO | 03/074287 | A1 | 9/2003 |
| WO | 2004/033206 | A1 | 4/2004 |

OTHER PUBLICATIONS

Machine translation of JP 2000-019724, published on Jan. 21, 2000.*
Official Communication issued in International Patent Application No. PCT/EP2007/051612, mailed on May 21, 2007.

* cited by examiner

*Primary Examiner* — Anca Eoff
(74) *Attorney, Agent, or Firm* — Keating & Bennett, LLP

(57) ABSTRACT

A heat-sensitive positive-working lithographic printing plate precursor includes a support having a hydrophilic surface or which is provided with a hydrophilic layer, a heat-sensitive coating including an IR absorbing agent, a phenolic resin, and a first polymer, wherein the first polymer is an alkaline soluble polymer including a monomeric unit having a structure according to Formula I or Formula II, wherein at least one of the aromatic groups $Ar^1$ and $Ar^2$ is an optionally substituted heteroaromatic group:

Formula I

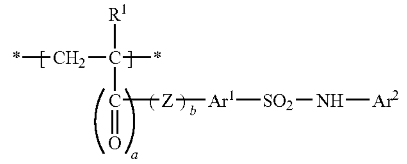

Formula II

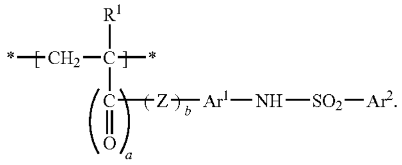

10 Claims, No Drawings

HEAT-SENSITIVE POSITIVE-WORKING LITHOGRAPHIC PRINTING PLATE PRECURSOR

CROSS-REFERENCE TO RELATED APPLICATIONS

This application is a 371 National Stage Application of PCT/EP2007/051612, filed Feb. 20, 2007. This application claims the benefit of U.S. Provisional Application No. 60/780,712, filed Mar. 8, 2006, which is incorporated by reference herein in its entirety. In addition, this application claims the benefit of European Application No. 06110501.1, filed Feb. 28, 2006, which is also incorporated by reference herein in its entirety.

BACKGROUND OF THE INVENTION

1. Field of the Invention

The present invention relates to a heat-sensitive positive-working lithographic printing plate precursor.

2. Description of the Related Art

Lithographic printing typically involves the use of a so-called printing master such as a printing plate which is mounted on a cylinder of a rotary printing press. The master carries a lithographic image on its surface and a print is obtained by applying ink to the image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called a plate precursor. A typical positive-working plate precursor includes a hydrophilic support and an oleophilic coating which is not readily soluble in an aqueous alkaline developer in the non-exposed state and becomes soluble in the developer after exposure to radiation. In addition to the well known photosensitive imaging materials which are suitable for UV contact exposure through a film mask (the so-called pre-sensitized plates), heat-sensitive printing plate precursors have also become very popular. Such thermal materials offer the advantage of daylight stability and are especially used in the so-called computer-to-plate method (CtP) wherein the plate precursor is directly exposed, i.e., without the use of a film mask. The material is exposed to heat or to infrared light and the generated heat triggers a (physico-)chemical process, such as ablation, polymerization, insolubilization by cross-linking of a polymer or by particle coagulation of a thermoplastic polymer latex, and solubilization by the destruction of intermolecular interactions or by increasing the penetrability of a development barrier layer.

Although some of these thermal processes enable plate making without wet processing, the most popular thermal plates form an image by a heat-induced solubility difference in an alkaline developer between exposed and non-exposed areas of the coating. The coating typically includes an oleophilic binder of which the rate of dissolution in the developer is either reduced (negative working) or increased (positive working) by the image-wise exposure.

Typically, the oleophilic resin in a heat-sensitive plate is a phenolic resin such as novolac, resol or a polyvinylphenolic resin. The phenolic resin can be chemically modified whereby the phenolic monomeric unit is substituted by a group such as described in WO 99/01795, EP 934 822, EP 1 072 432, U.S. Pat. No. 3,929,488, EP 2 102 443, EP 2 102 444, EP 2 102 445, EP 2 102 446. The phenolic resin can also been mixed with other polymers as described in WO 2004/020484, U.S. Pat. No. 6,143,464, WO 2001/09682, EP 933 682, WO 99/63407, WO 2002/53626, EP 1 433 594 and EP 1 439 058. The coating can also be composed of two or more layers, each of them including one or more of the above described resins as described in, e.g., EP 864420, EP 909657, EP-A 1011970, EP-A 1263590, EP-A 1268660, EP-A 1072432, EP-A 1120246, EP-A 1303399, EP-A 1311394, EP-A 1211065, EP-A 1368413, EP-A 1241003, EP-A 1299238, EP-A 1262318, EP-A 1275498, EP-A 1291172, WO 2003/74287, WO 2004/33206, EP-A 1433594 and EP-A 1439058.

The binder described in EP 864420 and EP 909 657 is a copolymer which contains not less than 10 mol % of a monomer having a sulphonamide group wherein at least one hydrogen atom is linked to a nitrogen atom.

SUMMARY OF THE INVENTION

The printing plate precursor of the preferred embodiments of the present invention is positive-working, i.e., after exposure and development, the exposed areas of the oleophilic coating, hereinafter also referred to as "heat-sensitive coating" or "coating", are removed from the support and define hydrophilic, non-image (non-printing) areas, whereas the unexposed coating is not removed from the support and defines an oleophilic image (printing) area.

An important prerequisite for a high quality printing plate precursor is a high sensitivity and a high chemical resistance of the coating, i.e., the resistance of the coating against printing liquids such as ink, e.g., UV-inks, fountain solution, and plate and blanket cleaners. The sensitivity is determined by the minimum energy for exposing the coating necessary to obtain a sufficient differentiation between the exposed and non-exposed area such that the exposed areas are completely removed by the developer without substantially affecting the non-exposed area.

The polymers of the prior art are not suited for use in the heat-sensitive coating because an insufficient chemical resistance against printing liquids is obtained. Therefore, the inventors discovered a new polymeric binder for the heat-sensitive coating which is able to exhibit a high sensitivity and which also has the advantage of a high chemical resistance of the coating.

In order to overcome the problems described above, preferred embodiments of the present invention provide a heat-sensitive lithographic printing plate precursor having the characteristic feature that the polymer in the heat-sensitive coating of the precursor includes a first monomeric unit having a structure according to Formula I or Formula II.

Other features, elements, processes, steps, characteristics and advantages of the present invention will become more apparent from the following detailed description of preferred embodiments of the present invention.

DETAILED DESCRIPTION OF PREFERRED EMBODIMENTS

In accordance with the preferred embodiments of the present invention, there is provided a heat-sensitive positive-working lithographic printing plate precursor including (1) a support having a hydrophilic surface or which is provided with a hydrophilic layer, (2) a heat-sensitive coating including an IR absorbing agent, a phenolic resin, and a first polymer, wherein the first polymer is an alkaline soluble polymer including a monomeric unit having a structure according to Formula I or Formula II:

Formula I

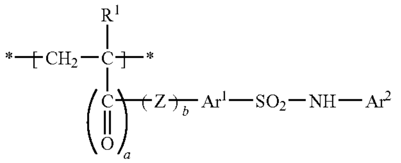

Formula II

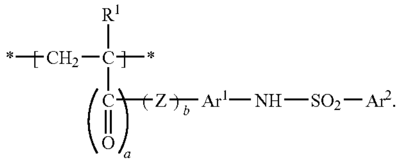

wherein

* denotes the binding sites of the monomeric unit in the polymer backbone, $R^1$ is hydrogen or an alkyl group, Z represents oxygen or —$NR^2$—, a and b independently are 0 or 1, $R^2$ is hydrogen or an optionally substituted alkyl, alkenyl, or alkynyl group, and $Ar^1$ and $Ar^2$ are aromatic groups with the proviso that at least one of $Ar^1$ and $Ar^2$ is an optionally substituted heteroaromatic group.

In the monomeric unit of a preferred embodiment of the present invention, $R^1$ is hydrogen or an alkyl group. The alkyl group is preferably a lower alkyl group such as a methyl, ethyl, propyl or butyl group, more preferably $R^1$ is hydrogen or a methyl group.

In the monomeric unit of a preferred embodiment of the present invention, Z represents oxygen or —$NR^2$—, preferably —$NR^2$— wherein $R^2$ is hydrogen or an optionally substituted alkyl, alkenyl or alkynyl group. $R^2$ is preferably hydrogen or an alkyl group, more preferably hydrogen.

In the monomeric unit of a preferred embodiment of the present invention, a and b are independently 0 or 1; preferably, a is 0 and b is 1; more preferably, a is 0 and b is 0; most preferably a is 1 and b is 1.

In the monomeric unit of a preferred embodiment of the present invention, when a is 0 and b is 1, Z is preferably oxygen.

In the monomeric unit of a preferred embodiment of the present invention, when a is 1 and b is 1, Z is preferably —$NR^2$— wherein $R^2$ is preferably hydrogen.

In the monomeric unit of a preferred embodiment of the present invention, $Ar^1$ and $Ar^2$ are aromatic groups with the proviso that at least one of $Ar^1$ and $Ar^2$ is an optionally substituted heteroaromatic group. $Ar^1$ is a bivalent aromatic group and $Ar^2$ is a monovalent aromatic group and these aromatic groups may be derived of the following aromatic compounds wherein one or two hydrogen atoms are replaced by one or two binding sites. The aromatic compounds may be selected from the group consisting of hydrocarbon aromatic compounds such as benzene, naphthalene or antracene, and heteroaromatic compounds such as furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine. All these compounds may be annulated such as benzofuran, benzothiophene, indole, indazole, benzoxazole, quinoline, quinazoline, benzimidazole or benztriazole, and/or substituted by at least a group selected from the group consisting of an alkyl, cycloalkyl alkenyl or cyclo alkenyl group, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphonic acid group or an alkyl ester thereof, a phosphoric acid group or an alkyl ester thereof, an amino group, a sulphonamide group, an amide group, a nitro group, a nitrile group a halogen or a combination of at least two of these groups, including at least one of these groups which is further substituted by one of these groups.

$Ar^2$ is preferably an optionally substituted heteroaromatic group, more preferably an optionally substituted heteroaromatic group having at least one nitrogen atom in the aromatic ring such as pyridine, pyradazine, pyrimidine, pyrazine, 1,3,5-triazine, 1,2,4-triazine, 1,2,3-triazine, pyrrole, pyrazole, imidazole, 1,2,3-triazole, 1,2,4-triazole, tetrazole, oxazole, isoxazole, thiazole, isothiazole, thiadiazole or oxadiazole.

In a preferred embodiment of the present invention, the monomeric unit has a structure according to Formula I.

Examples of monomeric units having the structure of Formula I or Formula II, given below as monomer, are:

Mono-01:

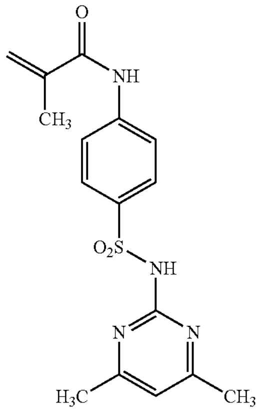

Mono-02:

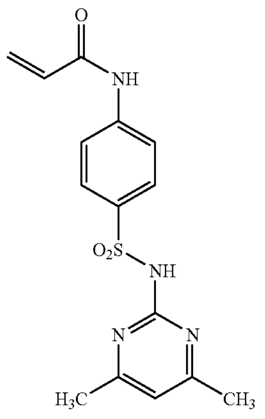

-continued
Mono-03:
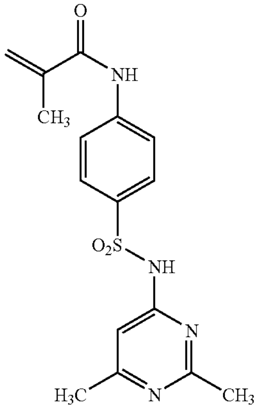
Mono-04:
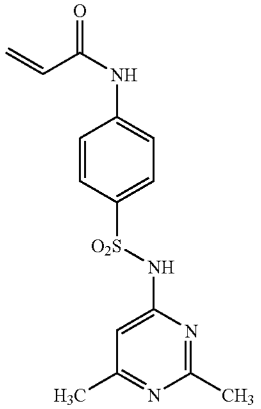
Mono-05:
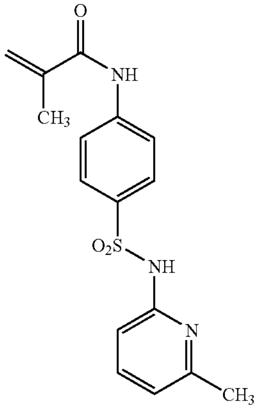
Mono-06:
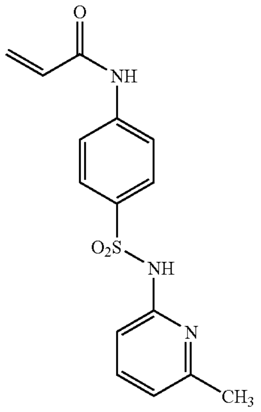
-continued
Mono-07:
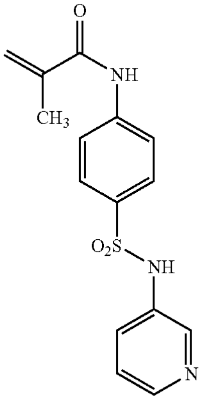
Mono-08:
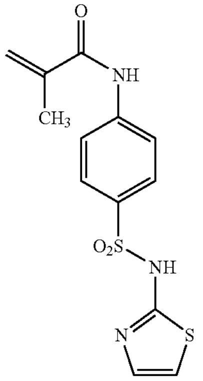
Mono-09:
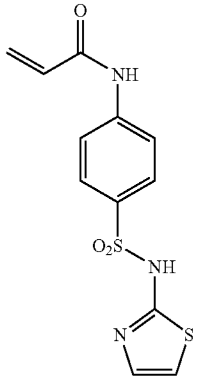
Mono-10:
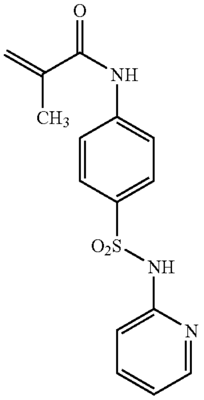

-continued
Mono-11:
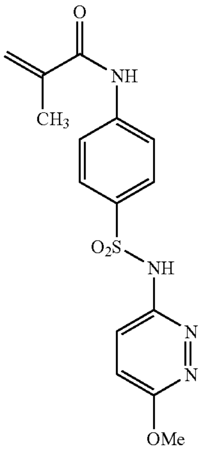
Mono-12:
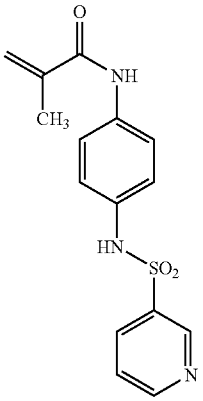
Mono-13:
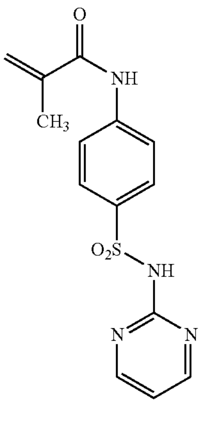
-continued
Mono-14:
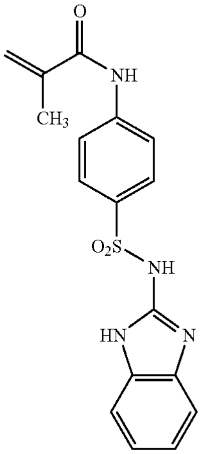
Mono-15:
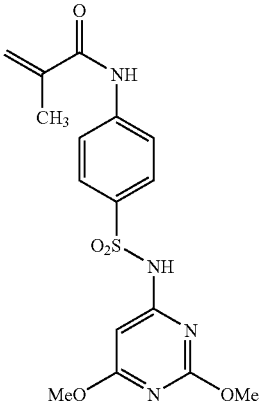
Mono-16:
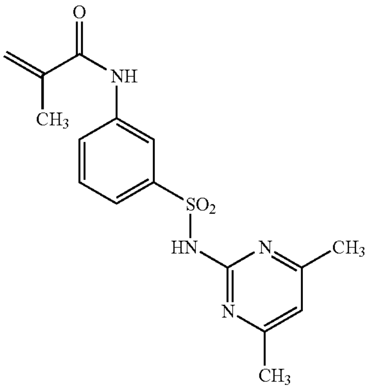
Mono-17:
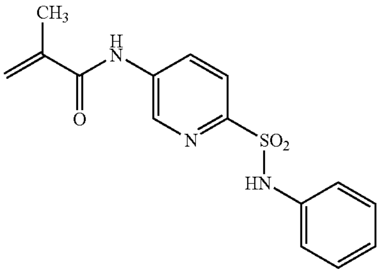

-continued
Mono-18:
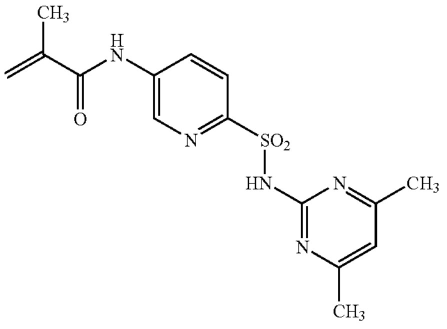
Mono-19:
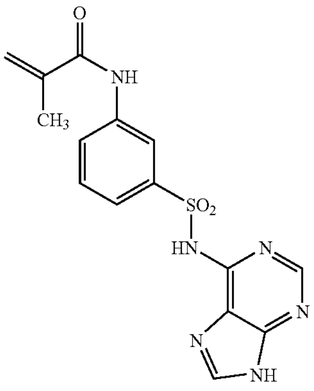
Mono-20:
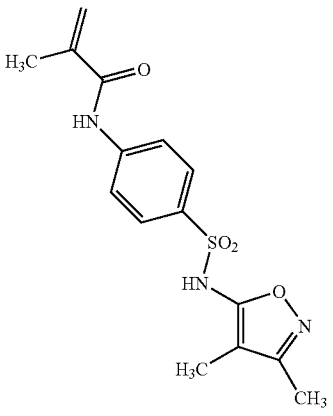
Mono-21:
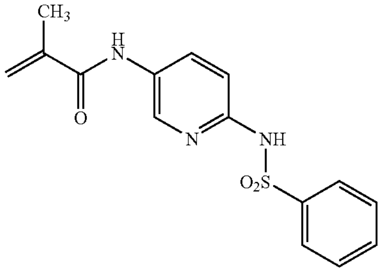
-continued
Mono-22:
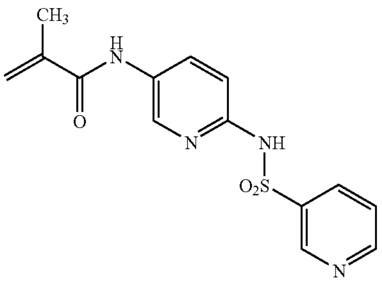
Mono-23:
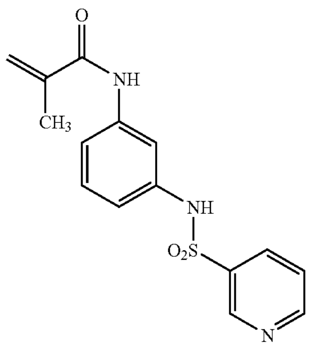
Mono-24:
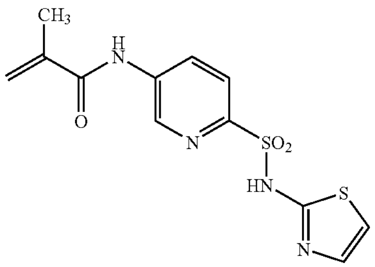
Mono-25:
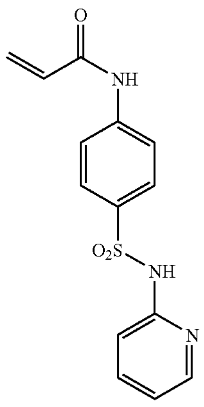

-continued

Mono-26:

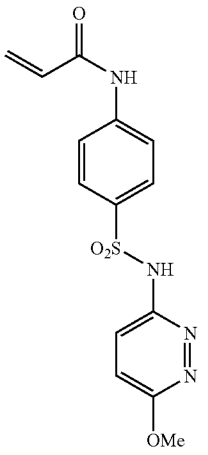

Mono-27:

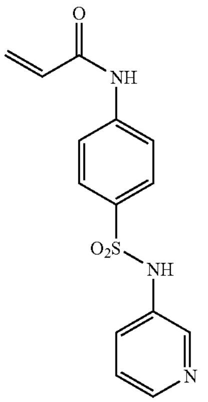

The first polymer according to a preferred embodiment of the present invention includes a monomeric unit having a structure according to Formula I or Formula II and is soluble in an alkaline solution. In a preferred embodiment, the first polymer includes the monomeric unit in an amount of at least 10 mol %, more preferably at least 20 mol %, most preferably at least 30 mol %. The upper range may be 100 mol %, preferably at most 90 mol % more preferably at most 80 mol %, most preferably at most 70 mol %.

The first polymer may further include other monomeric units with the proviso that the first polymer is soluble in an alkaline solution. These other monomeric units may be selected from hydrophobic monomers, i.e., monomers which include in the side chain of the monomeric unit a hydrophobic group such as an alkyl or aryl group, and/or from hydrophilic monomers, i.e., monomers which include in the side chain of the monomeric unit a hydrophilic group such as acid group or an amide, hydroxyl or ethyleneoxide group. The type of the other co-monomers and the amount of them in the first polymer are selected such that the first polymer is soluble in an alkaline solution. The other co-monomers may be selected from the group consisting of (meth)acryl amide, an optionally N-substituted (meth)acryl amide, an optionally N-substituted maleimide, an ester of a (meth)acrylic acid, polyoxyethylene chain in the ester group of a (meth)acrylic acid ester, 2-hydroxy ethyl(meth)acrylate, an optionally substituted styrene, a styrene sulphonic acid, an o-, p- or m-vinyl benzoic acid, an optionally substituted vinyl pyridine, N-vinyl caprolactam, N-vinyl pyrrolidone, (meth)acrylic acid, itaconic acid, maleic acid, glycidyl(meth)acrylate, optionally hydrolysed vinyl acetate and vinyl phosphonic acid. Preferable other co-monomers are N-benzyl(meth)acrylamide and (meth)acrylic acid.

The first polymer preferably has a molecular weight ranging for $M_n$, i.e., number average molecular weight, between and 500,000, more preferably between 10,000 and 200,000, most preferably between 10,000 and 2,100,000, and for $M_w$, i.e., weight average molecular weight, between 10,000 and 1,000,000, more preferably between 20,000 and 500,000, most preferably between 20,000 and 200,000. These molecular weights are determined by the method as described in the Examples.

Examples of first polymers, composed of monomeric units as indicated below, of preferred embodiments of the present invention are:

Polymer Composition-01:

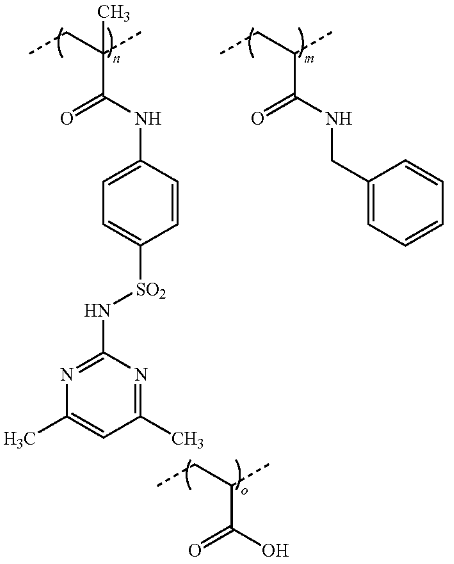

Polymer Composition-02:

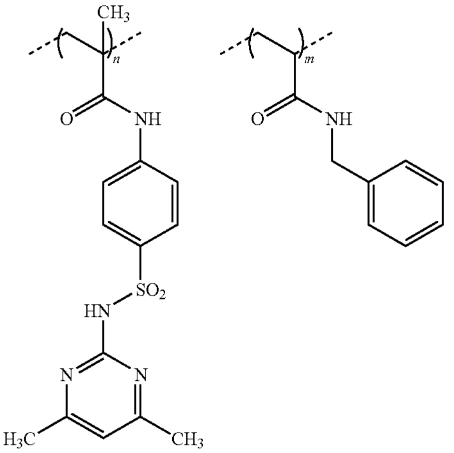

-continued
Polymer Composition-03:
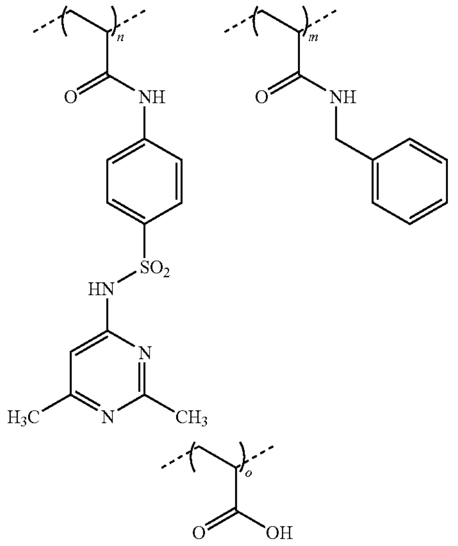
Polymer Composition-04:
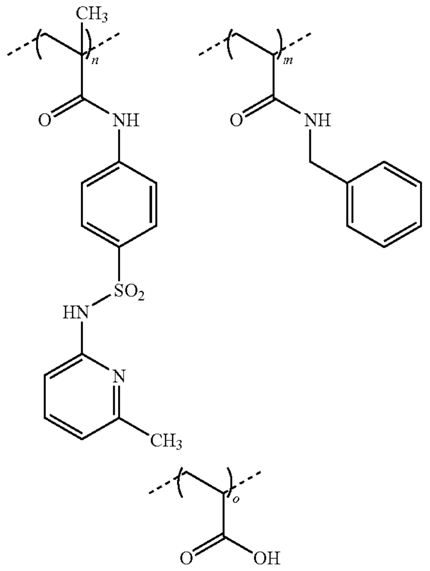
Polymer Composition-05:
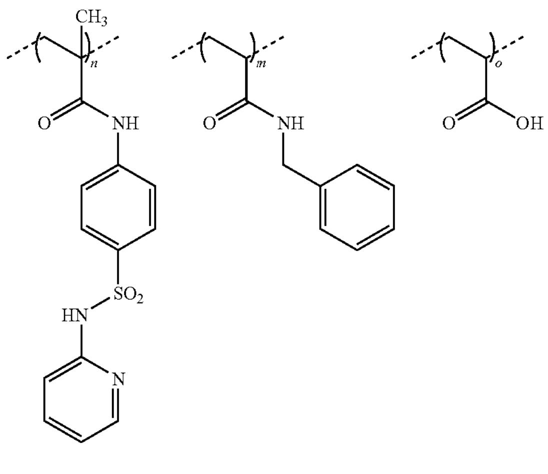
-continued
Polymer Composition-06:
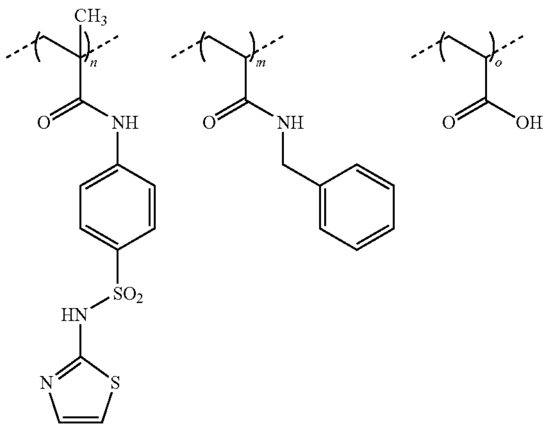
Polymer Composition-07:
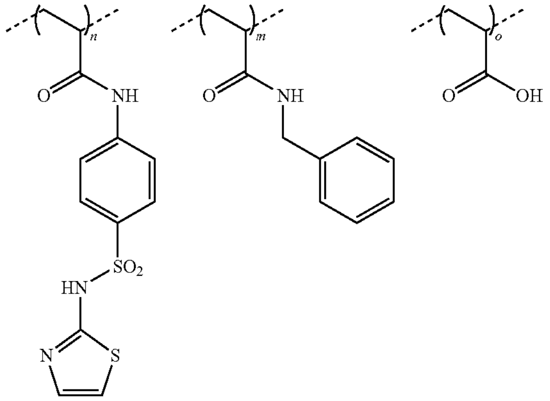
Polymer Composition-08:
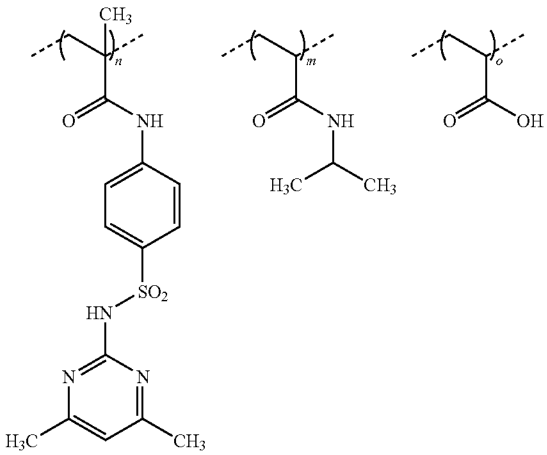

-continued
Polymer Composition-09:
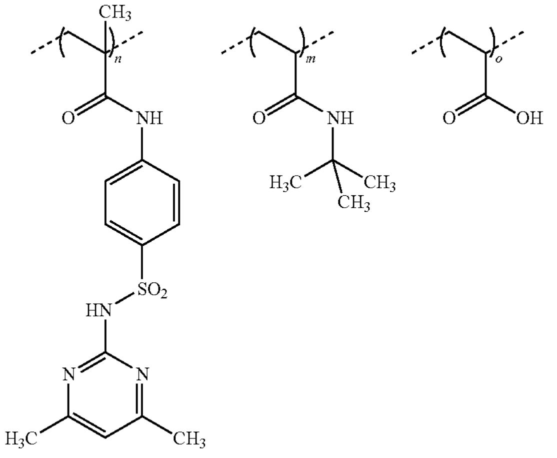
Polymer Composition-10:
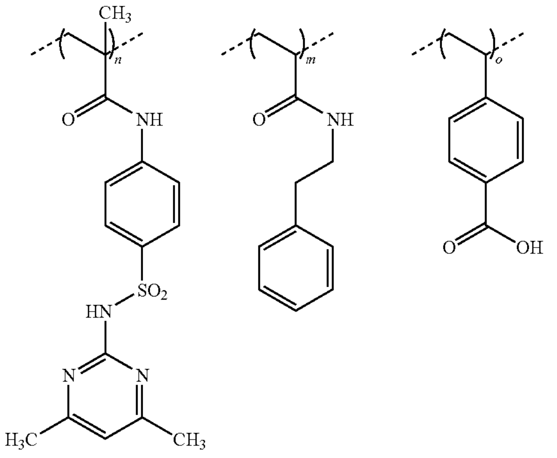
Polymer Composition-11:
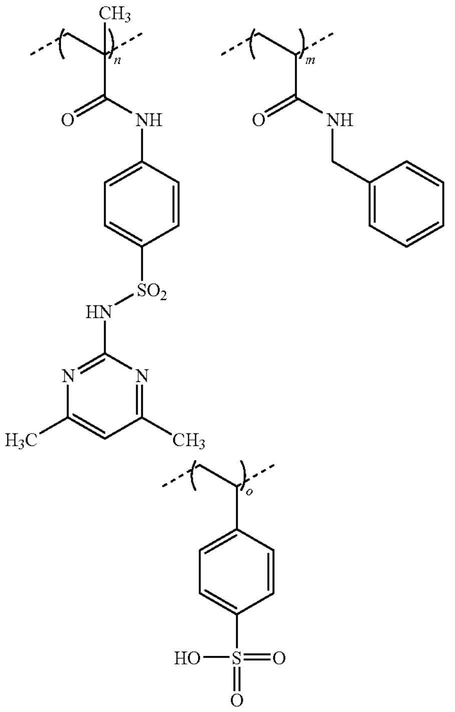
-continued
Polymer Composition-12:
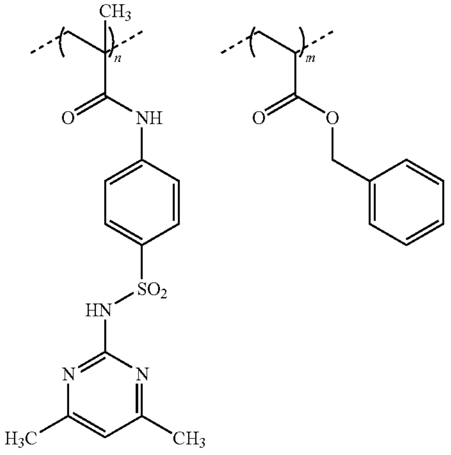
Polymer Composition-13:
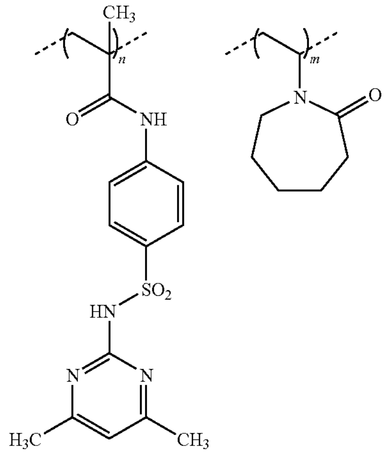
Polymer Composition-14:
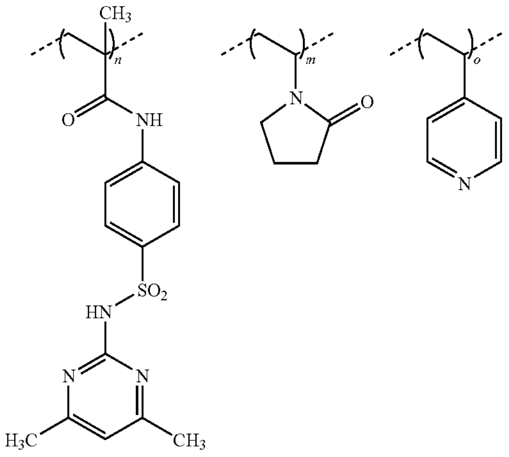

-continued
Polymer Composition-15:
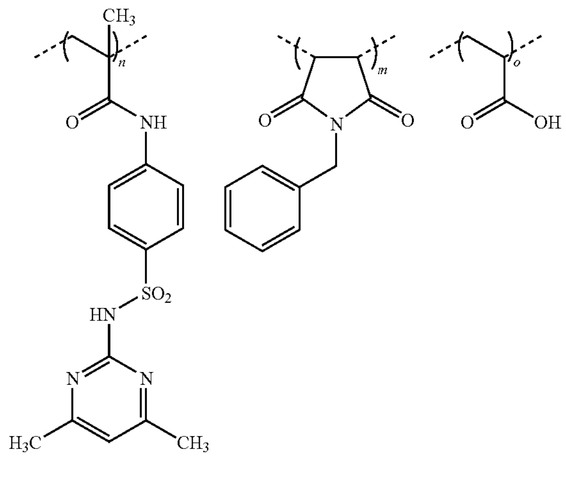
Polymer Composition-16:
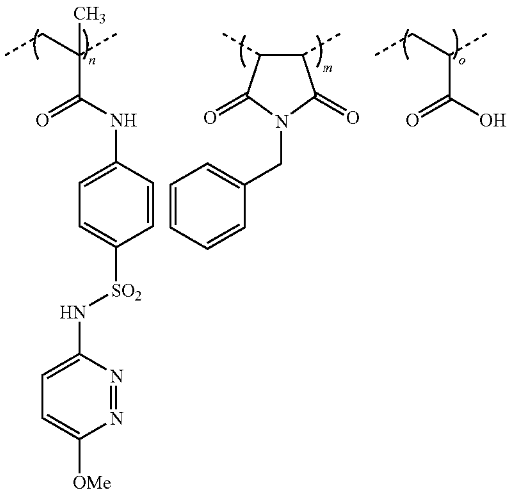
Polymer Composition-17:
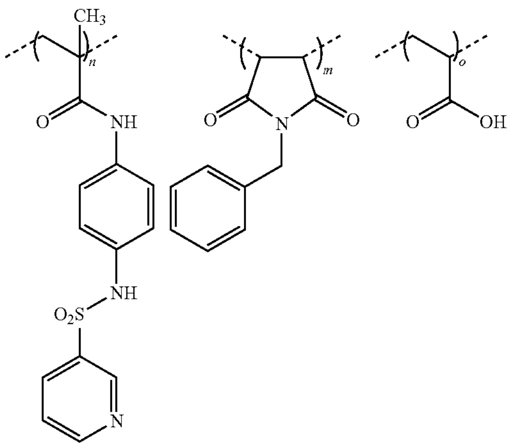
-continued
Polymer Composition-18:
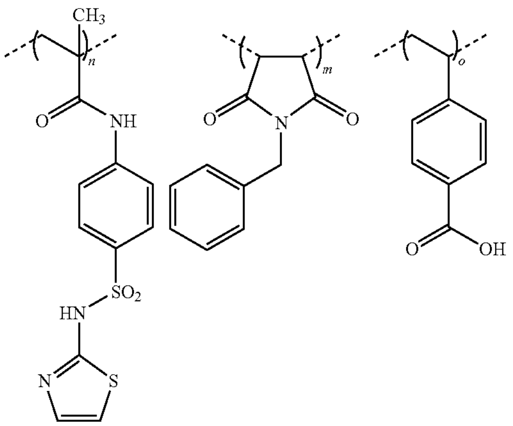
Polymer Composition-19:
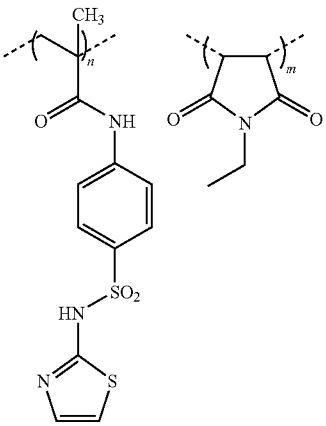
Polymer Composition-20:
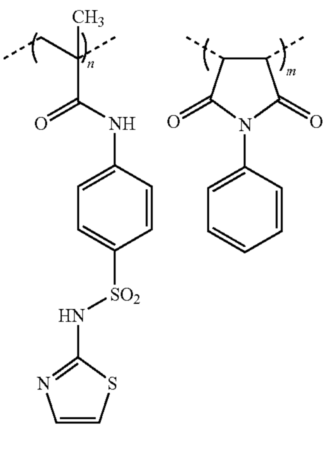

-continued

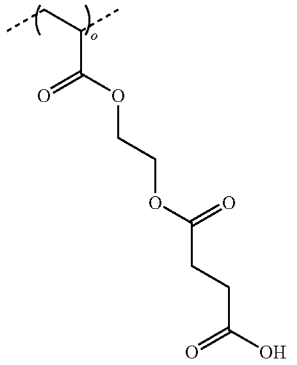

Polymer Composition-21:

The same composition of monomeric units as in Polymer with the exception that the monomeric unit of acrylic acid is replaced by the monomeric unit of N-(4-hydroxy-3,5-dimethyl-benzyl-acrylamide, wherein the indices n, m and o represents the mol ratio of each monomeric unit in the polymer and n ranges preferably between 10 and 90 mol %, m ranges preferably between 5 and 80 mol % and o ranges preferably between 0 and 50 mol %.

Examples of first polymers, represented by the composing monomers in a molar ratio as indicated below, of preferred embodiments of the present invention are:

Polymer-01:

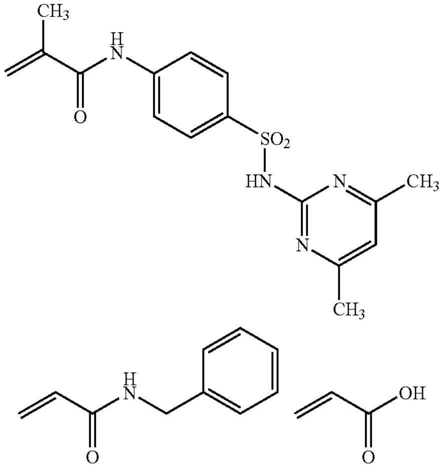

Monomer ratio (mol %): 50/40/10

Polymer-02:

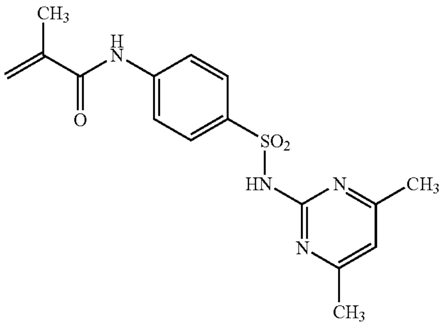

-continued

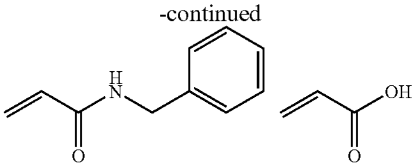

Monomer ratio (mol %): 54/44/2

Polymer-03:

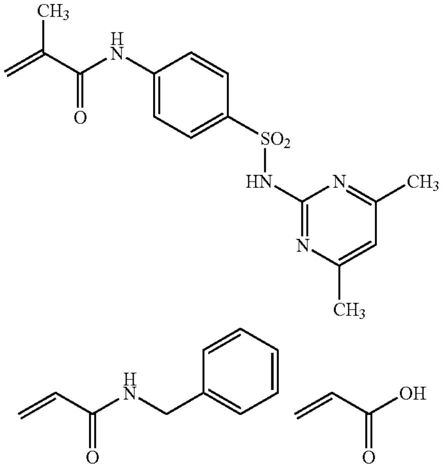

Monomer ratio (mol %): 40/50/10

Polymer-04:

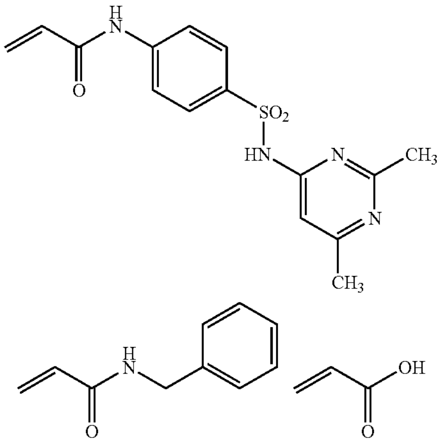

Monomer ratio (mol %): 54/44/2

Polymer-05:

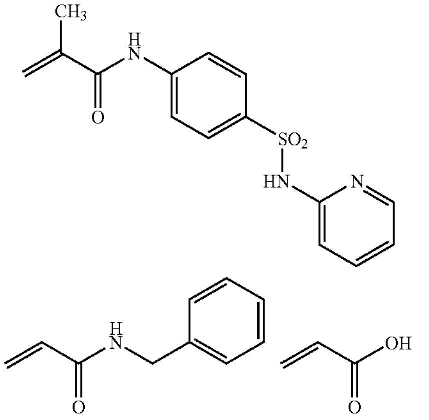

Monomer ratio (mol %): 54/44/2

-continued

Polymer-06:

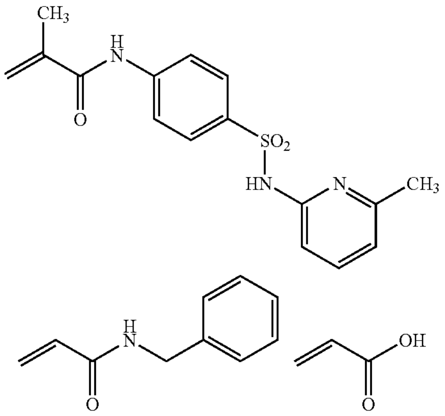

Monomer ratio (mol %): 54/44/2

Polymer-07:

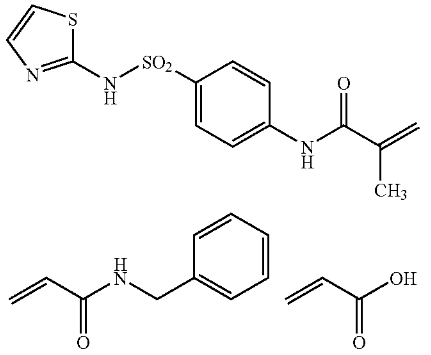

Monomer ratio (mol %): 40/50/10

Polymer-08:

monomer Mono-01, N-(4-hydroxy-3,5-dimethyl-benzyl-acrylamide and N-benzyl-maleimide, having a Monomer ratio (mol %): 33.8/35/31.2

Comparative polymer-01:

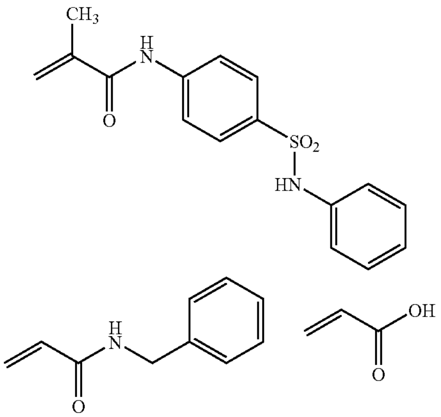

Monomer ratio (mol%):50/40/10

The heat-sensitive lithographic printing plate precursor includes a support having a hydrophilic surface or which is provided with a hydrophilic layer, and, on the support, a heat-sensitive coating.

Support

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. A preferred support is a metal support such as aluminum or stainless steel. The metal can also be laminated to a plastic layer, e.g., polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30° C. to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

Coating

The heat-sensitive coating, which is provided on the support, is positive-working. The coating of a positive-working heat-sensitive coating does not dissolve in an alkaline developing solution in the unexposed areas and becomes soluble in the exposed areas within the time used for developing the plate. The coating includes a first polymer as defined above, an infrared absorbing agent, and a phenolic resin. The phenolic resin is an alkaline soluble oleophilic resin wherein the solubility in an alkaline developing solution is reduced in the coating and wherein the solubility in an alkaline developing solution is increased upon heating or IR-radiation. The coating preferably further includes a dissolution inhibitor whereby the rate of dissolution in an alkaline developing solution is reduced. Due to this solubility differential, the rate of dissolution of the exposed areas is sufficiently higher than in the non-exposed areas.

The phenolic resin is preferably a novolac, a resol or a polyvinylphenolic resin; novolac is more preferred. Typical examples of such polymers are described in DE-A-4007428, DE-A-4027301 and DE-A-4445820. Other preferred polymers are phenolic resins wherein the phenyl group or the hydroxy group of the phenolic monomeric unit are chemically modified with an organic substituent as described in EP 894 622, EP 901 902, EP 933 682, WO 99/63407, EP 934 822, EP 1 072 432, U.S. Pat. No. 5,641,608, EP 982 123, WO 99/01795, WO 04/035310, WO 04/035686, WO 04/035645, WO 04/035687 or EP 1 506 858.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may also be a polymer of one or more hydroxy-phenyl containing monomers such as hydroxystyrenes or hydroxy-phenyl(meth)acrylates. Examples of such hydroxystyrenes are o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl(meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxyphenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1,000 to 200,000 g/mol, more preferably from 1,500 to 50,000 g/mol.

Examples of phenolic resins are:

POL-01: ALNOVOL SPN452 is a solution of a novolac resin, 40% by weight in Dowanol PM, obtained from CLARIANT GmbH.

Dowanol PM consists of 1-methoxy-2-propanol (>99.5%) and 2-methoxy-1-propanol (<0.5%).

POL-02: ALNOVOL SPN400 is a solution of a novolac resin, 44% by weight in Dowanol PMA, obtained from CLARIANT GmbH.

Dowanol PMA consists of 2-methoxy-1-methyl-ethylacetate.

POL-03: ALNOVOL HPN100 a novolac resin obtained from CLARIANT GmbH.

POL-04: DURITE PD443 is a novolac resin obtained from BORDEN CHEM. INC.

POL-05: DURITE SD423A is a novolac resin obtained from BORDEN CHEM. INC.

POL-06: DURITE SD126A is a novolac resin obtained from BORDEN CHEM. INC.

POL-07: BAKELITE 6866LB02 is a novolac resin obtained from BAKELITE AG.

POL-08: BAKELITE 6866LB03 is a novolac resin obtained from BAKELITE AG.

POL-09: KR 400/8 is a novolac resin obtained from KOYO CHEMICALS INC.

POL-10: HRJ 1085 is a novolac resin obtained from SCHNECTADY INTERNATIONAL INC.

POL-11: HRJ 2606 is a phenol novolac resin obtained from SCHNECTADY INTERNATIONAL INC.

POL-12: LYNCUR CMM is a copolymer of 4-hydroxy-styrene and methyl methacrylate obtained from SIBER HEGNER.

In accordance with a more preferred embodiment of the present invention, the heat-sensitive coating includes a heat-sensitive layer and an intermediate layer. The intermediate layer is present between the heat-sensitive layer and the hydrophilic surface of the support. In a still more preferred embodiment, the heat-sensitive layer includes a phenolic resin and optionally an inhibitor, and the intermediate layer includes a first polymer as defined above.

The heat-sensitive coating may further include another polymer which is insoluble in water and soluble in an alkaline solution such as an organic polymer which has acidic groups with a pKa of less than 13 to ensure that the layer is soluble or at least swellable in aqueous alkaline developers. Advantageously, the binder is a polymer or polycondensate, for example a polyester, a polyamide resin, an epoxy resin, an acetal resin, an acrylic resin, a methacrylic resin, a styrene based resin, a polyurethane resin or polyurea. The polymer may have one or more functional groups selected from the list of:

(i) a sulfonamide group such as $—SO_2—NH—R^g$ wherein $R^g$ represents a hydrogen or an optionally substituted hydrocarbon group such as an optionally substituted alkyl, aryl or heteroaryl group, (ii) an active imide group such as $—SO_2—NH—CO—R^h$, $—SO_2—NH—SO_2—R^h$ or $—CO—NH—SO_2—R^h$ wherein $R^h$ represents a hydrogen or an optionally substituted hydrocarbon group such as an optionally substituted alkyl, aryl or heteroaryl group, (iii) a carboxyl group, (iv) a sulfonic group, and (v) a phosphoric group; a sulfonamide group or an active imide group are more preferred. The polymer may be selected from a copolymer including a N-benzyl-maleimide monomeric unit or a monomeric unit including a sulfonamide group as described in EP-A 933 682, EP 0 894 622 (page 3 line 16 to page 6 line 30), EP-A 0 982 123 (page 3 line 56 to page 51 line 5), EP-A 1 072 432 (page 4 line 21 to page 10 line 29) and WO 99/63407 (page 4 line 13 to page 9 line 37).

Other polymers having an acidic group are polycondensates and polymers having free phenolic hydroxyl groups, as obtained, for example, by reacting phenol, resorcinol, a cresol, a xylenol or a trimethylphenol with aldehydes, especially formaldehyde, or ketones, may be added to the heat-sensitive coating. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxy-phenyl-maleimides are likewise suitable. Furthermore, polymers having units of vinylaromatics, N-aryl(meth)acrylamides or aryl(meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl(meth)acrylate, of N-(4-hydroxyphenyl)(meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide. The polymers may additionally contain units of other monomers which have no acidic units. Such units include vinylaromatics, methyl(meth)acrylate, phenyl(meth)acrylate, benzyl (meth)acrylate, methacrylamide or acrylonitrile.

Dissolution Inhibitor

In a preferred embodiment of the present invention, the heat-sensitive coating or the heat-sensitive layer also preferably includes one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer at the exposed areas. The dissolution inhibitor exhibits a substantial latitude in the dissolution rate between the exposed and non-exposed areas. By preference, the dissolution inhibitor has a good dissolution rate latitude when the exposed coating areas have dissolved completely in the developer before the non-exposed areas are attacked by the developer to such an extent that the ink-accepting capability of the coating is affected. The dissolution inhibitor(s) can be added to the layer which includes the hydrophobic polymer discussed above.

The dissolution rate of the non-exposed coating in the developer is preferably reduced by interaction between the hydrophobic polymer and the inhibitor, due to, e.g., hydrogen bonding between these compounds. Suitable dissolution inhibitors are preferably organic compounds which include at least one aromatic group and a hydrogen bonding site, e.g., a carbonyl group, a sulfonyl group, or a nitrogen atom which may be quaternized and which may be part of a heterocyclic ring or which may be part of an amino substituent of the organic compound. Suitable dissolution inhibitors of this type have been disclosed in, e.g., EP-A 825 927 and EP-A 823 327.

Water-repellent polymers represent another type of suitable dissolution inhibitors. Such polymers seem to increase the developer resistance of the coating by repelling the aqueous developer from the coating. The water-repellent polymers can be added to the layer including the first polymer and/or can be present in a separate layer provided on top of the layer with the first polymer. In the latter preferred embodiment, the water-repellent polymer forms a barrier layer which shields the coating from the developer, and the solubility of the barrier layer in the developer or the penetrability of the barrier layer by the developer can be increased by exposure to heat or infrared light, as described in e.g., EP-A 864420, EP-A 950 517 and WO 99/21725. Preferred examples of the water-repellent polymers are polymers including siloxane and/or perfluoroalkyl units. In one preferred embodiment, the coating contains such a water-repellent polymer in an amount between 0.5 and 25 mg/$m^2$, preferably between 0.5 and 15 mg/$m^2$ and most preferably between 0.5 and 10 mg/$m^2$. When the water-repellent polymer is also ink-repelling, e.g., in the case of polysiloxanes, higher amounts than 25 mg/$m^2$ can result in poor ink-acceptance of the non-exposed areas. An amount lower than 0.5 mg/$m^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another preferred embodiment, the water-repellent polymer is a block-copolymer or a graft-copolymer of a poly(alkylene oxide) block and a block of a polymer including siloxane and/or perfluoroalkyl units. A suitable copolymer includes about 15 to 25 siloxane units and 50 to 70 alkylene oxide groups. Preferred examples include copolymers including phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, automatically positions itself at the interface between the coating and air and thereby forms a separate top layer even when the whole coating is applied from a single coating solution. Simultaneously, such surfactants act as a spreading agent which improves the coating quality. Alternatively, the water-repellent polymer can be applied in a second solution, coated on top of the layer including the hydrophobic polymer. In that preferred embodiment, it may be advantageous to use a solvent in the second coating solution that is not capable of dissolving the ingredients present in the first layer so that a highly concentrated water-repellent phase is obtained at the top of the coating.

Development Accelerator

Preferably, also one or more development accelerators are included in the heat-sensitive coating or in the heat-sensitive layer, i.e., compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A 60-88942 and JP-A 2-96755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole.

Exposure

The material can be image-wise exposed directly with heat, e.g., by a thermal head, or indirectly by infrared light, which is preferably converted into heat by an infrared light absorbing compound, which may be a dye or pigment having an absorption maximum in the infrared wavelength range. The infrared light absorbing dye or pigment is preferably present in the heat-sensitive coating or the heat-sensitive layer and typically in a concentration ranging between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye IR-1:

(IR-1)

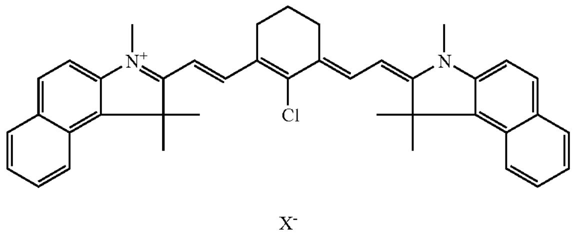

wherein $X^-$ is a suitable counter ion such as tosylate.

The heat-sensitive coating, or the heat-sensitive layer and/or the intermediate layer, may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e., the coating does not become more soluble in the developer upon exposure to visible light. Suitable examples of such a contrast dye are the quaternized triarylmethane dyes.

According to a preferred embodiment, the contrast dye is present in the heat-sensitive coating, or the heat-sensitive layer and/or the intermediate layer.

According to a highly preferred embodiment, the infrared light absorbing compound is concentrated in the heat-sensitive coating or the heat-sensitive layer.

The printing plate precursor can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e., the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g., from 0.1 to 10 m/sec.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in, e.g., U.S. Pat. No. 5,174,205 and U.S. Pat. No. 5,163,368.

In the development step, the non-image areas of the coating are removed by immersion in an aqueous alkaline developer, which may be combined with mechanical rubbing, e.g., by a rotating brush. The developer includes an alkaline agent which may be an inorganic alkaline agent such as an alkali metal hydroxide, an organic alkaline agent such as an amine, and/or an alkaline silicate such as an alkali metal silicate or an alkali metal metasilicate. The developer preferably has a pH above 10, more preferably above 12. The developer may further contain components such as a buffer substance, a complexing agent, an antifoaming agent, an organic solvent, a corrosion inhibitor, a dye, an antisludge agent, a dissolution preventing agent such as a non-ionic surfactant, an anionic, cationic or amphoteric surfactant and/or a hydrotropic agent as known in the art. The developer may further contain a poly hydroxyl compound such as e.g., sorbitol, preferably in a concentration of at least 40 g/l, and also a polyethylene oxide containing compound such as, e.g., Supronic B25, commercially available from RODIA, preferably in a concentration of at most 0.15 g/l.

The development step may be followed by a rinsing step and/or a gumming step. The gumming step involves post-treatment of the lithographic printing plate with a gum solution. A gum solution is typically an aqueous liquid which includes one or more surface protective compounds that are capable of protecting the lithographic image of a printing plate against contamination or damaging. Suitable examples of such compounds are film-forming hydrophilic polymers or surfactants.

The plate precursor can, if required, be post-treated with a suitable correcting agent or preservative as known in the art. To increase the resistance of the finished printing plate and hence to extend the run length, the layer can be briefly heated to elevated temperatures ("baking"). The plate can be dried before baking or is dried during the baking process itself. During the baking step, the plate can be heated at a temperature which is higher than the glass transition temperature of the heat-sensitive coating, e.g., between 100° C. and 230° C. for a period of 40 seconds to 5 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a preferred embodiment, the single-fluid ink includes an ink phase, also called the hydrophobic or oleophilic phase, and a polyol phase as described in WO 00/32705.

EXAMPLES

Synthesis of Monomers for the First Polymer

The synthesis of Mono-01, Mono-02, Mono-08, Mono-09 and Mono-13 have been described by Hofmann et al., Makromoleculare Chemie, 177, 1791-1813 (1976). Several other monomers have been prepared according to the following reaction schemes. Those skilled in the art would understand that numerous variations for the preparation of different monomers are possible.

Mono-11 has been prepared similar to Kang and Bae, Journal of Controlled Release, 80, 145-155. The details for the synthesis are given below.

The synthesis of Mono-11

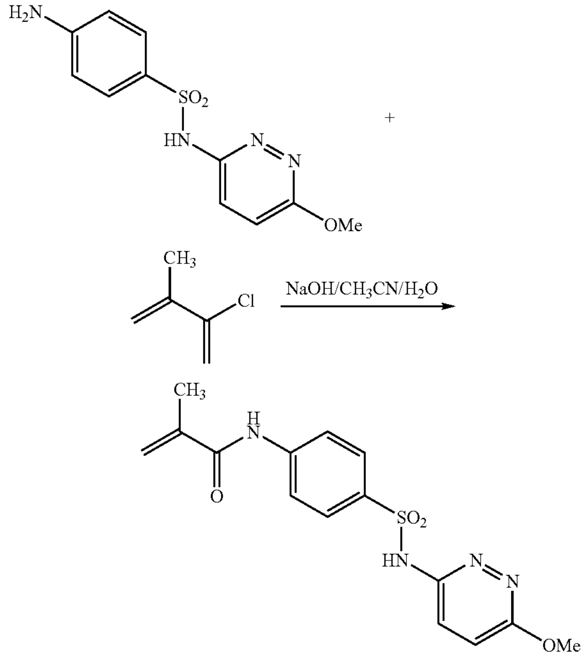

mono-11

10 g (35.6 mmol) 4-amino-N-(6-methoxy-3-pyridazinyl)-benzenesulfonamide was suspended in 120 ml acetonitrile. A solution of 1.42 g (35.6 mmol) NaOH in 30 ml water was added and the reaction mixture cooled to −10° C. A solution of 3.72 g (35.6 mmol) methacryloyl chloride in 10 ml acetonitrile was added dropwise, while the temperature was kept at −10° C. The reaction was allowed to continue for 1 hour at room temperature. 10 mg BHT was added and the mixture was evaporated under reduced pressure. The oily residue was dissolved in a mixture of 150 ml methylene chloride and 100 ml 2N HCl. The methylene chloride was extracted with 50 ml 2N HCl and 100 ml water, dried over $MgSO_4$ and evaporated under reduced pressure. The compound was purified, using preparative column chromatography. 2.39 g of Mono-11 (19%) was isolated.

Mono-04 has been prepared according to a similar method, using acryloyl chloride instead of methacryloyl chloride.

The synthesis of Mono-04:

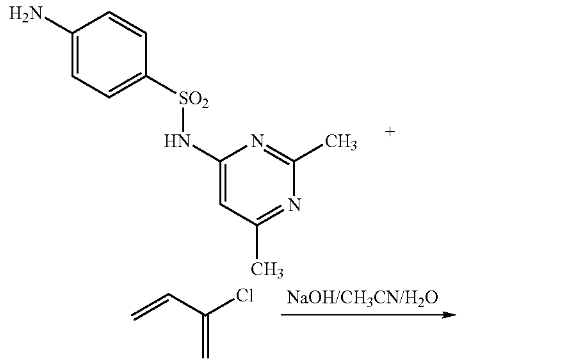

-continued

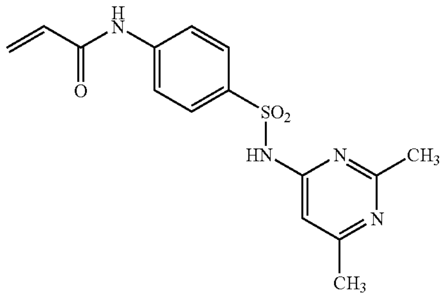

mono-4

24.9 g (89.5 mmol) 4-amino-N-(2,6-dimethyl-4-pyrimidinyl)-benzenesulfonamide was suspended in 500 ml acetonitrile. A solution of 5.01 g (89.5 mmol) KOH in 75 ml water was added. The reaction mixture was cooled to 0° C. and a solution of 8.10 g (89.5 mmol) acryloyl chloride was added dropwise. The reaction was allowed to continue for 14 hours at room temperature. A small precipitate was formed and was removed by filtration. 25 mg BHT was added and the reaction mixture was evaporated under reduced pressure. The residue was dissolved in 350 ml refluxing methanol. After cooling down to room temperature, the methanol solution was added to 1.6 l of a hexane methyl tert. butyl ether mixture (1/1). The precipitated crude mono-4 was isolated by filtration and dried. Mono-04 was purified, using preparative column chromatography.

The synthesis of Mono-10:

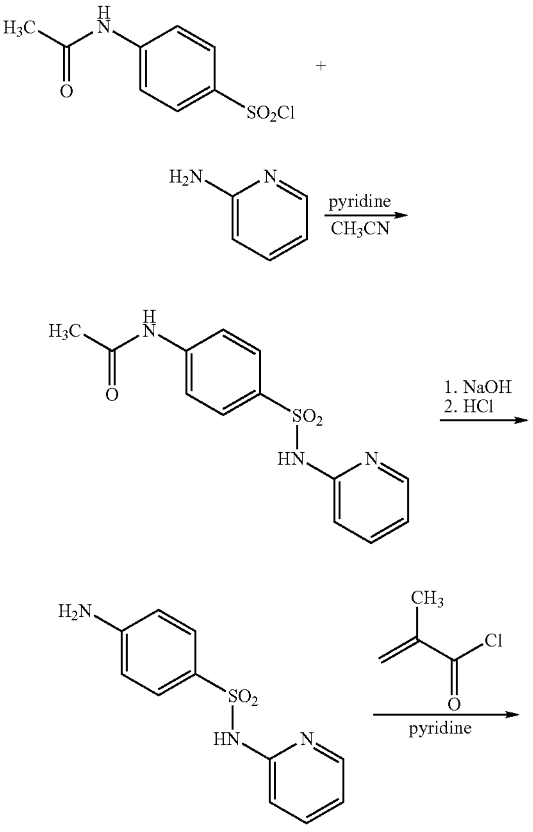

-continued

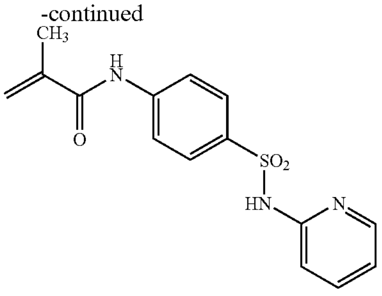

mono-10

Preparation of the Intermediate 4-amino-N-2-pyridinyl-benzenesulfonamide 288.75 g (1.21 mol) 4-(acetylamino)-benzenesulfonyl chloride and 113.8 g (1.21 mol) 2-aminopyridine were dissolved in 1350 ml acetoniltrile. 105.2 g (1.33 mol) pyridine was added over 5 minutes and the mixture was heated to 60° C. The reaction was allowed to continue for 2 hours at 60° C. Upon cooling down, N-[4-[(2-pyridinylamino)sulfonyl]phenyl]-acetamide partially precipitated from the medium and was isolated by filtration. A second crop was isolated by evaporation of the filtrate under reduced and treating the residue with 1500 ml water/ice. A second part of N-[4-[(2-pyridinylamino)sulfonyl]phenyl]-acetamide was isolated by filtration. The two fractions were combined and treated with 1500 ml water at 40° C. N-[4-[(2-pyridinylamino)sulfonyl]phenyl]-acetamide was isolated by filtration and dried. 155.9 g (55%) of N-[4-[(2-pyridinylamino)sulfonyl]phenyl]-acetamide was isolated.

The isolated N-[4-[(2-pyridinylamino)sulfonyl]phenyl]-acetamide was dissolved in 2.5 l of a mixture of ethanol and 1-methoxy-2-propanol (1/1). 105 g (2.66 mol) NaOH was added and the mixture was refluxed for an hour. The reaction mixture was allowed to cool down to room temperature and the solvent was removed under reduced pressure. The residue was dissolved in 1300 ml water and the mixture was acidified to pH 1 using HCl (conc.). The precipitated impurities were removed by filtration and the aqueous fraction was extracted three times with 450 ml methylene chloride. The aqueous fraction was neutralized to pH 7, using a 10 N NaOH solution. 4-amino-N-2-pyridinyl-benzenesulfonamide precipitated from the medium, was isolated by filtration and dried. 93.4 g (70.7%) of 4-amino-N-2-pyridinyl-benzenesulfonamide was isolated.

Preparation of Mono-10:

24.9 g (0.1 mol) 4-amino-N-2-pyridinyl-benzenesulfonamide and 0.25 g BHT were dissolved in 400 ml pyridine. The reaction mixture was cooled to 0° C. 12.54 g (0.12 mol) methacryloyl chloride was added dropwise. The reaction was allowed to continue for 1 hour between 0 and 5° C., followed by reaction over night at room temperature. The solvent was removed under reduced pressure and the residue was poured into 1 l ethanol/water 1/1. The crude mono-10 precipitated from the medium, was isolated by filtration and dried. The crude mono-10 was refluxed in 200 ml acetone/water 1/1, isolated a second time by filtration and dried. 16.3 g (49%) of Mono-10 was isolated.

Mono-05, Mono-06 and Mono-07 were prepared using a very similar methodology as illustrated by their respective reaction schemes.

Mono-05:

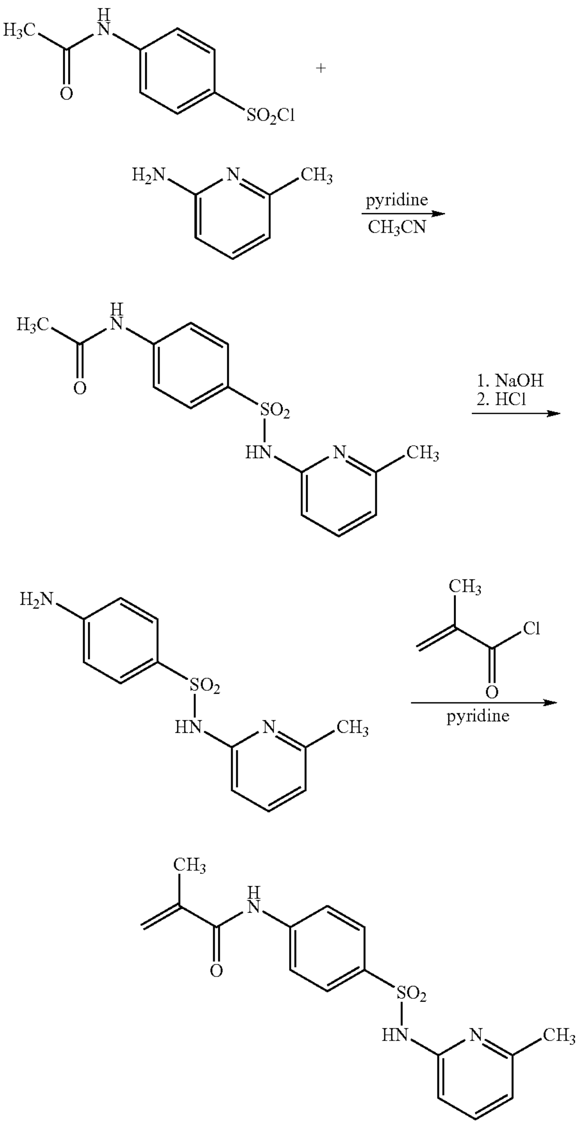

mono-5

Mono-07:

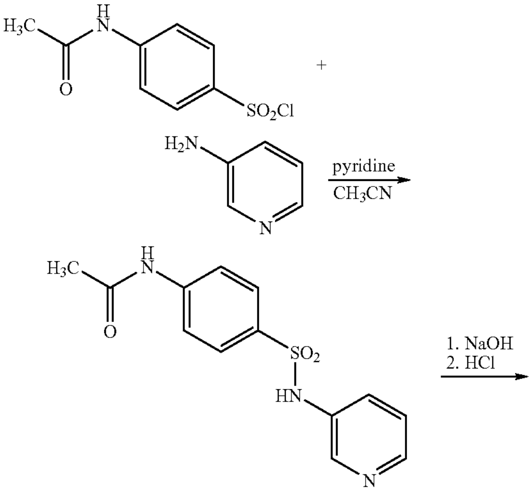

-continued

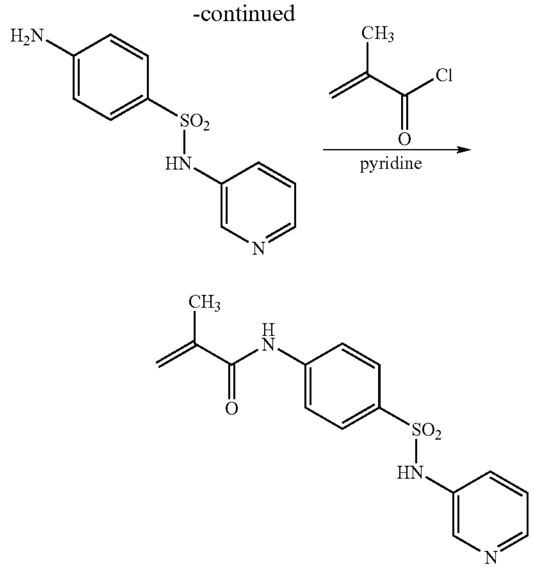

mono-7

The synthesis of Comparative Monomer-01:

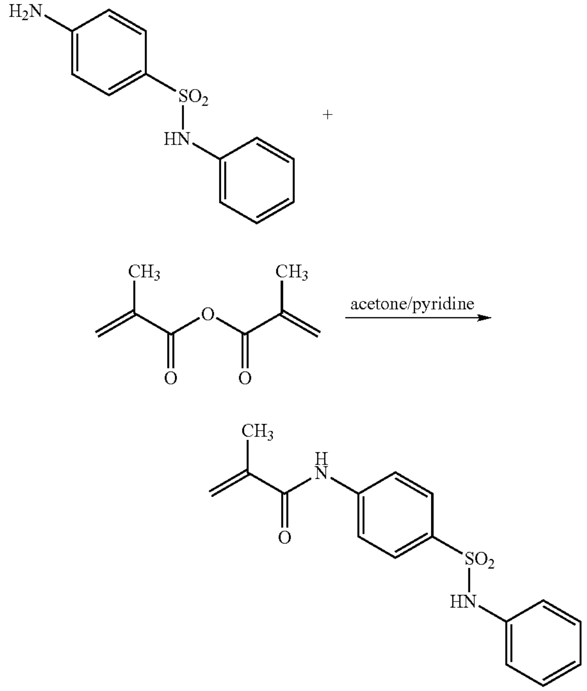

124.15 g (0.5 mol) 4-amino-N-phenyl-benzenesulfonamide, 1.57 g sodium dithionite and 1.65 g BHT were dissolved in 1 l dimethyl acetamide. 92.50 g (0.6 mol) methacrylic anhydride was added followed by the addition of 39.55 g (0.5 mol) pyridine. The reaction mixture was heated to 140° C. for 16 hours. The reaction mixture was allowed to cool down to room temperature and poured into 5 l ice/water. The precipitated crude product was isolated and refluxed in 300 ml methanol. The mixture was allowed to cool down to room temperature and Comparative Monomer-01 was isolated by filtration and dried. 89 g (56%) of Comparative Monomer-01 was isolated.

The synthesis of the other monomers can be carried out in a similar method as described above.

Preparation of Polymer-01 and Comparative Polymer-01

In a 250 ml reactor, 160 mmol of the appropriate sulphonamide, i.e., Mono-01 for Polymer-01 and Comparative Monomer-01 for Comparative Polymer-01, 20.6 g (132 mmol) benzyl acrylamide, 2.31 g (32 mmol) acrylic acid and 104 g gamma-butyrolactone were added and the mixture was heated to 140° C., while stirring at 200 rpm. A constant flow of nitrogen was put over the reactor. After dissolution of all the components, the reactor was cooled to 100° C. 0.37 ml Trigonox DC50, commercially available from AKZO NOBEL, was added followed by the addition of 1.48 ml Trigonox 141, commercially available from AKZO NOBEL, in 3.66 ml butyrolactone. The polymerization was started and the reactor was heated to 140° C. over 2 hours while dosing 1.87 ml Trigonox DC50. The mixture was stirred at 400 rpm and the polymerization was allowed to continue for 2 hours at 140° C. The reaction mixture was cooled to 120° C. and the stirrer speed was increased to 500 rpm. 86.8 ml 1-methoxy-2-propanol was added and the reaction mixture was allowed to cool down to room temperature.

The polymers were analyzed with $^1$H-NMR-spectroscopy and size exclusion chromatography, using dimethyl acetamide/0.21% LiCl as eluent on a 3× mixed-B column and relative to polystyrene standards.

| | $M_n$ | $M_w$ | PD |
|---|---|---|---|
| Polymer-01 | 21800 | 66400 | 3.05 |
| Comparative Polymer-01 | 15450 | 28300 | 1.83 |

Preparation of Polymer-02 and Polymer-04 to Polymer-06

In a 250 ml reactor, 162 mmol of the appropriate sulfonamide, i.e., Mono-01 for Polymer-02, Mono-03 for Polymer-04, Mono-07 for Polymer-05 and Mono-05 for Polymer-06, 21.3 g (132 mmol) benzyl acrylamide, 0.43 g (6 mmol) acrylic acid and 103 g gamma-butyrolactone were added and the mixture was heated to 140° C., while stirring at 200 rpm. A constant flow of nitrogen was put over the reactor. After dissolution of all the components, the reactor was cooled to 100° C. 0.35 ml Trigonox DC50 was added followed by the addition of 1.39 ml Trigonox 141 in 3.43 ml butyrolactone. The polymerization was started and the reactor was heated to 140° C. over 2 hours while dosing 1.75 ml Trigonox DC50. The mixture was stirred at 400 rpm and the polymerization was allowed to continue for 2 hours at 140° C. The reaction mixture was cooled to 120° C. and the stirrer speed was increased to 500 rpm. 85.7 ml 1-methoxy-2-propanol was added and the reaction mixture was allowed to cool down to room temperature.

Polymer-02 was analyzed with $^1$H-NMR-spectroscopy and size exclusion chromatography, using dimethyl acetamide/0.21% LiCl as eluent on a 3× mixed-B column and relative to polystyrene standards.

| | $M_n$ | $M_w$ | PD |
|---|---|---|---|
| Polymer-02 | 23500 | 67000 | 2.84 |
| Polymer-04 | 34800 | 65730 | 4.76 |
| Polymer-05 | 23400 | 44800 | 1.91 |
| Polymer-06 | 24250 | 55270 | 2.24 |

Preparation of Polymer-03 and Polymer-07

In a 250 ml reactor, 132 mmol of the appropriate sulphonamide, i.e., Mono-01 for Polymer-03 and Mono-08 for Polymer-07, 25.0 g (160 mmol) benzyl acrylamide, 2.31 g (32 mmol) acrylic acid and 104 g gamma-butyrolactone were added and the mixture was heated to 140° C., while stirring at 200 rpm. A constant flow of nitrogen was put over the reactor. After dissolution of all the components, the reactor was cooled to 100° C. 0.37 ml Trigonox DC50, commercially available from AKZO NOBEL, was added followed by the addition of 1.48 ml Trigonox 141, commercially available from AKZO NOBEL, in 3.66 ml butyrolactone. The polymerization was started and the reactor was heated to 140° C. over 2 hours while dosing 1.87 ml Trigonox DC50. The mixture was stirred at 400 rpm and the polymerization was allowed to continue for 2 hours at 140° C. The reaction mixture was cooled to 120° C. and the stirrer speed was increased to 500 rpm. 86.8 ml 1-methoxy-2-propanol was added and the reaction mixture was allowed to cool down to room temperature.

Polymer-04 was analyzed with $^1$H-NMR-spectroscopy and size exclusion chromatography, using dimethyl acetamide/0.21% LiCl as eluent on a 3× mixed-B column and relative to polystyrene standards.

| | $M_n$ | $M_w$ | PD |
|---|---|---|---|
| Polymer-03 | 30520 | 85000 | 2.78 |
| Polymer-07 | 17860 | 29830 | 1.67 |

Preparation of the Lithographic Support

A 0.30 mm thick aluminum foil was degreased by immersing the foil in an aqueous solution containing 34 g/l of sodium hydroxide at 70° C. for 6 seconds and rinsed with demineralized water for 3.6 seconds. The foil was then electrochemically grained for 8 seconds using an alternating current in an aqueous solution containing 15 g/l HCl, 15 g/l $SO_4^{2-}$ ions and 5 g/l $Al^{3+}$ at a temperature of 37° C. and a current density of 100 A/dm$^2$. The aluminum foil was then desmutted by etching with an aqueous solution containing 145 g/l of sulfuric acid at 80° C. for 5 seconds and rinsed with demineralized water for 4 seconds. The foil was subsequently subjected to anodic oxidation for 10 seconds in an aqueous solution containing 145 g/l of sulfuric acid at a temperature of 57° C. and a current density of 25 A/dm$^2$, then washed with demineralized water for 7 seconds and post-treated for 4 seconds with a solution containing 2.2 g/l of polyvinylphosphonic acid at 70° C., rinsed with demineralized water for 3.5 seconds and dried at 120° C. for 7 seconds.

The support thus obtained was characterized by a surface roughness $R^a$ of 0.35-0.40 μm (measured with interferometyer NT1100) and an anodic weight of 3.0 g/m$^2$.

Preparation of the First Coating of the Printing Plate Precursor PPP-01 to PPP-09

The first coating of PPP-01 to PPP-09 was produced by first applying a first coating layer defined in Table 1 and Table onto the above described lithographic support. The coating was applied at a wet coating thickness of 20 μm and then dried at 135° C. The total dry coating weight amounts to 0.995 g/m$^2$ for PPP-02 and 0.67 g/m$^2$ for PPP-01 and PPP-03 to PPP-09.

TABLE 1

| Composition of the Solution of the First Coating Layer of PPP-01 to PPP-05 | | | | | |
|---|---|---|---|---|---|
| INGREDIENTS | PPP-01 | PPP-02 | PPP-03 | PPP-04 | PPP-05 |
| Dowanol (1) | 12.44 | 19.54 | 12.44 | 12.44 | 3.66 |
| Butyrolactone | | 7.95 | | | 9.03 |
| THF (2) | 28.86 | | 28.86 | 28.86 | 26.17 |
| Comparative Polymer-01 (25 wt. %) (3) | 7.74 | | | | |
| Polymer-01 (25 wt. %) (4) | | 7.74 | | | |
| Polymer-02 (25 wt. %) (5) | | | 7.74 | 7.46 | |
| Polymer-03 (22 wt. %) (6) | | | | | 8.17 |
| Crystal Violet (1 wt. %) (7) | 2.82 | 2.94 | 2.93 | 2.82 | 2.71 |
| Tegoglide 410 (1 wt. %) (8) | 0.28 | 0.39 | 0.29 | 0.28 | 0.27 |

(1) Dowanol PM is 1-methoxy-2-propanol, commercially available from DOW CHEMICAL Company.
(2) THF is tetrahydrofuran.
(3) A solution of 25% by weight of Comparative Polymer-01, see preparation above.
(4) A solution of 25% by weight of Polymer-01, see preparation above.
(5) A solution of 25% by weight of Polymer-02, see preparation above.
(6) A solution of 22% by weight of Polymer-03, see preparation above.
(7) Crystal Violet, commercially available from CIBA-GEIGY.
(8) TEGOGLIDE 410 is a copolymer of polysiloxane and poly(alkylene oxide), commercially available from TEGO CHEMIE SERVICE GmbH.

TABLE 2

| Composition of the Solution of the First Coating Layer of PPP-06 to PPP-09 | | | | |
|---|---|---|---|---|
| INGREDIENTS | PPP-06 | PPP-07 | PPP-08 | PPP-09 |
| Dowanol (1) | 12.44 | 12.44 | 12.44 | 3.66 |
| Butyrolactone | | | | 9.03 |
| THF (2) | 28.86 | 28.86 | 28.86 | 26.17 |
| Polymer-04 (25 wt. %) (9) | 7.74 | | | |
| Polymer-05 (25 wt. %) (10) | | 7.74 | | |
| Polymer-06 (25 wt. %) (11) | | | 7.74 | |
| Polymer-07 (22 wt. %) (12) | | | | 8.17 |
| Crystal Violet (1 wt. %) (7) | 2.93 | 2.93 | 2.93 | 2.71 |
| Tegoglide 410 (1 wt. %) (8) | 0.29 | 0.29 | 0.29 | 0.27 |

(9) A solution of 25% by weight of Polymer-04, see preparation above.
(10) A solution of 25% by weight of Polymer-05, see preparation above.
(11) A solution of 25% by weight of Polymer-06, see preparation above.
(12) A solution of 22% by weight of Polymer-07, see preparation above.

Preparation of the Second Coating of the Printing Plate Precursor PPP-01 to PPP-03 and PPP-06 to PPP-08

On the first coated layer, a second layer as defined in Table 3 was coated at a wet coating thickness of 25 μm for PPP-02 and 16 μm for PPP-01, PPP-03 and PPP-06 to PPP-08 and dried at 135° C. The dry coating weight for the second layer amounts to g/m$^2$ for PPP-02 and 0.75 g/m$^2$ for PPP-01, PPP-03 and PPP-06 to PPP-08.

TABLE 3

Composition of the Solution of the Second Coating Layer for PPP-01 to PPP-03 and PPP-06 to PPP-08

| INGREDIENTS | PPP-01 | PPP-02 | PPP-03 | PPP-06 | PPP-07 | PPP-08 |
|---|---|---|---|---|---|---|
| Dowanol PM (1) | 40.47 | 30.72 | 40.47 | 40.47 | 40.47 | 40.47 |
| Butanone | 71.78 | 62.93 | 71.78 | 71.78 | 71.78 | 71.78 |
| Alnovol SPN452 (40 wt. %) (2) | 15.92 | 15.92 | 15.92 | 15.92 | 15.92 | 15.92 |
| TMCA (10 wt. %) (3) | 6.01 | 8.22 | 6.01 | 6.01 | 6.01 | 6.01 |
| SOO94 (4) | 0.27 | 0.33 | 0.27 | 0.27 | 0.27 | 0.27 |
| Crystal Violet (1 wt. %) (5) | 10.73 | 9.67 | 10.73 | 10.73 | 10.73 | 10.73 |
| Fluorad FC4432 (1 wt. %) (6) | 5.36 | | 5.36 | 5.36 | 5.36 | 5.36 |
| Tegowet 265 (1 wt. %) (7) | | 1.36 | | | | |
| Tegoglide 410 (1 wt. %) (8) | 1.07 | 4.45 | 1.07 | 1.07 | 1.07 | 1.07 |

(1) See Table 1.
(2) Alnovol SPN452 is a novolac solution, 40.5% by weight in Dowanol PM, commercially available from CLARIANT.
(3) TMCA is 3,4,5-trimethoxy cinnamic acid.
(4) SOO94 is an IR absorbing cyanine dye, commercially available from FEW CHEMICALS; the chemical structure of SOO94 is equal to IR-1
(5) See Table 1.
(6) FLUORAD FC4432 is a solution of a fluor-copolymer 1% by weight in Dowanol PM, commercially available from 3M.
(7) TEGOWET 265 is a solution of a copolymer of polysiloxane and poly(alkylene oxide) 1% by weight in Dowanol PM, commercially available from TEGO CHEMIE SERVICE GmbH.
(8) See Table 1.

Chemical Resistance and Sensitivity

The chemical resistance was measured on the printing plate precursors, coated only by the first coating layer, because the chemical resistance is essentially determined by the type of the first coating layer, more specifically by the type of the polymer used in the first coating layer. The differentiation in the rate of dissolution of the coating between the exposed and non-exposed area such that the exposed areas are completely removed by the developer without substantially affecting the non-exposed area, i.e., the sensitivity of the printing plate precursor, is essentially determined by the second coating layer.

For measuring the chemical resistance 3 different solutions were selected:

Test solution 1: EMERALD PREMIUM MXEH, commercially available from ANCHOR;

Test solution 2: Allied Meter-X, commercially available from ABC Chemicals;

Test solution 3: Prisco 2351, a phosphate free fountain concentration, commercially available from PRISCO.

The chemical resistance was tested by contacting a droplet of 40 μl of a test solution on different spots of the coating. After 3 minutes, the droplet was removed from the coating with a cotton pad. The attack on the coating due to each test solution was rated by visual inspection as follows:

0: no attack,

1: changed gloss of the coating's surface,

2: small attack of the coating (thickness is decreased),

3: heavy attack of the coating,

4: completely dissolved coating.

The higher the rating, the less the chemical resistance of the coating. The results for the test solutions on each coating are summarized in Table 5.

The printing plate precursors PPP-01 to PPP-03 and PPP-06 to PPP-08, coated with the first and the second layer, were exposed with a Creo Trendsetter TH318 (plate-setter, trademark from Creo, Burnaby, Canada), operating at varying energy densities.

After exposure the plates were processed by dipping the plate precursors in developer, as defined in Table 4, at a temperature of 25° C. for 30 seconds.

TABLE 4

Composition of the Developing Solution

| INGREDIENTS | Developer (g) |
|---|---|
| Na-metasilicate (1) | 100 |
| Crafol AP261 (2) | 10.82 |
| Surfynol 104H (3) | 0.67 |
| Synperonic T304 (4) | 4.32 |
| Water until | 1000 |

(1) Na-metasilicate is sodium metasilicate pentahydrate, commercially available from SILMACO NV.
(2) Crafol AP261 is alkylether sodium salt, commercially available from COGNIS.
(3) Surfynol 104H is a surfactant, commercially available from KEYSER&MACKAY.
(4) Synperonic T304 is a block-copolymer of polyethylene oxide (=PEO) and polypropylene oxide (=PPO) attached to ethylenediamine (=EDA) in a ratio EDA/PEO/PPO of 1/15/14 and having a mean molecular weight of 1600, commercially available from UNIQEMA.

The right exposure, hereinafter also referred to as RE, is defined as that energy density which fits best with a 50% dot coverage on the plate when the precursor is exposed with 1×1 and a 8×8 checkerboard. The dot coverage is determined by measuring the optical density with a GretagMacbeth D19C densitometer, commercially available from Gretag-MacBeth AG.

The sensitivity is defined by the RE value and the lower the RE value, the higher is the sensitivity of the precursor. The results are summarized in Table 5.

TABLE 5

Results for Chemical Resistance and Sensitivity

| Example number | Type Precursor | Test solution 1 | Test solution 2 | Test solution 3 | RE ($mJ/cm^2$) |
|---|---|---|---|---|---|
| Comparative example 1 | PPP-01 | 3 | 3 | 3 | 140 |
| Inventive Example 1 | PPP-02 | 1 | 1 | 1 | 97 |
| Inventive Example 2 | PPP-03 | 1 | 1 | 1 | 140 |
| Inventive Example 3 | PPP-04 | 0 | 1 | 1 | |
| Inventive Example 4 | PPP-05 | 1 | 1 | 1 | |
| Inventive Example 5 | PPP-06 | 2 | 1 | 2 | 120 |
| Inventive Example 6 | PPP-07 | 1 | 1 | 1 | 180 |
| Inventive Example 7 | PPP-08 | 2 | 1 | 1 | 180 |
| Inventive Example 8 | PPP-09 | 2 | 1 | 1 | |

The Examples in Table 5 demonstrate that all the precursors are characterised by a RE value ranging between 97 $mJ/cm^2$ and 180 $mJ/cm^2$, indicating a high sensitivity. A precursor with a high sensitivity has typically a RE value lower than 250 $mJ/cm^2$. The Inventive Examples demonstrate that the precursors including a first polymer according to the preferred embodiments of the present invention, give rise to a significant increase of the chemical resistance of the coating compared with the Comparative Example 1 wherein such a polymer is not present.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A heat-sensitive positive-working lithographic printing plate precursor comprising:

a support having a hydrophilic surface or which is provided with a hydrophilic layer;

a heat-sensitive coating including an IR absorbing agent, a phenolic resin, and a first polymer; wherein the first polymer is an alkaline soluble polymer including a monomeric unit having a structure according to Formula I or Formula II:

Formula I

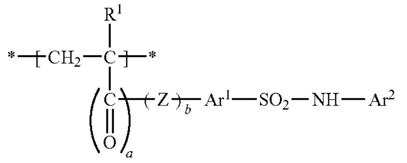

Formula II

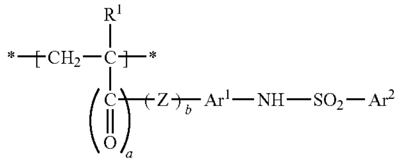

wherein:

* denotes binding sites of the monomeric unit in the polymer backbone;

$R^1$ is hydrogen or an alkyl group;

Z represents oxygen or —$NR^2$—;

a and b independently are 0 or 1;

$R^2$ is hydrogen or an optionally substituted alkyl, alkenyl, or alkynyl group; and $Ar^1$ and $Ar^2$ are an aromatic group with the proviso that at least one of $Ar^1$ and $Ar^2$ is an optionally substituted heteroaromatic group.

2. A precursor according to claim 1, wherein the $Ar^2$ is an optionally substituted heteroaromatic group.

3. A precursor according to claim 1, wherein the monomeric unit has a structure according to Formula I.

4. A precursor according to claim 1, wherein the optionally substituted heteroaromatic group includes at least one nitrogen atom in the aromatic ring.

5. A precursor according to claim 1, wherein the optionally substituted heteroaromatic group is selected from the group consisting of an optionally substituted furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine, benzofuran, benzothiophene, indole, indazole, benzoxazole, quinoline, quinazoline, benzimidazole, and benztriazole.

6. A precursor according to claim 1, wherein the first polymer further includes other monomeric units selected from the group consisting of an optionally N-substituted (meth)acryl amide monomeric unit, an optionally N-substituted maleimide monomeric unit, an ester of a (meth)acrylic acid, polyoxyethylene (meth)acrylic acid ester, 2-hydroxy ethyl (meth)acrylate, an optionally substituted styrene, a styrene sulphonic acid, an o-, p- or m-vinyl benzoic acid, an optionally substituted vinyl pyridine, N-vinyl caprolactam, N-vinyl pyrrolidone, (meth)acrylic acid, itaconic acid, maleic acid, glycidyl (meth)acrylate, optionally hydrolysed vinyl acetate, and vinyl phosphonic acid.

7. A precursor according to claim 1, wherein the first polymer includes a monomeric unit having a structure according to Formula I or Formula II, and the monomeric unit of the monomers N-benzyl (meth)acrylamide and (meth)acrylic acid.

8. A precursor according to claim 1, wherein the monomeric unit having a structure according to Formula I or Formula II is present in the first polymer in an amount ranging between 10 mol % and 90 mol %.

9. A method for making a lithographic printing plate comprising the steps of:

providing a heat-sensitive lithographic printing plate precursor as defined in claim 1;

image-wise exposing the precursor with IR-radiation or heat; and developing the image-wise exposed precursor.

10. A method for improving the chemical resistance of a heat-sensitive coating of a heat-sensitive lithographic printing plate precursor:

providing a heat-sensitive lithographic printing plate precursor including a support and a heat-sensitive coating including an alkaline soluble polymer, the alkaline soluble polymer including a monomeric unit having a structure according to Formula I or Formula II:

Formula I

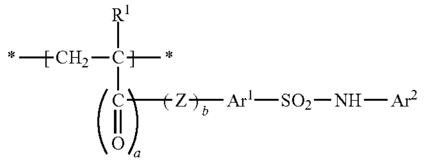

Formula II

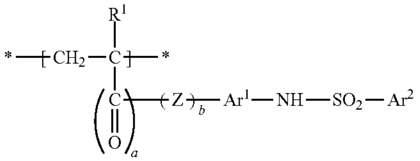

wherein:

* denotes binding sites of the monomeric unit in the polymer backbone;

$R^1$ is hydrogen or an alkyl group;

Z represents oxygen or —$NR^2$—;

a and b independently are 0 or 1;

$R^2$ is hydrogen or an optionally substituted alkyl, alkenyl, or alkynyl group; and $Ar^1$ and $Ar^2$ are an aromatic group with the proviso that at least one of $Ar^1$ and $Ar^2$ is an optionally substituted heteroaromatic group.

* * * * *